(12) United States Patent
Chen et al.

(10) Patent No.: US 6,888,248 B2
(45) Date of Patent: May 3, 2005

(54) EXTENDED LENGTH METAL LINE FOR IMPROVED ESD PERFORMANCE

(75) Inventors: Shui-Hung Chen, Hsin-Chu (TW); Jian-Hsing Lee, Hsin-Chu (TW); Jiaw-Ren Shih, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/401,090

(22) Filed: Mar. 26, 2003

(65) Prior Publication Data

US 2004/0188841 A1 Sep. 30, 2004

(51) Int. Cl.$^7$ .............................................. H01L 23/48
(52) U.S. Cl. ...................... 257/758; 257/355; 257/173; 257/174; 257/297; 257/328; 257/357; 257/358; 361/301.2; 437/60; 438/618
(58) Field of Search .................... 257/355, 173, 257/174, 297, 328, 357, 358; 361/301.2; 437/60; 438/618

(56) References Cited

U.S. PATENT DOCUMENTS

| | | | | |
|---|---|---|---|---|
| 5,597,758 A | * | 1/1997 | Heim et al. | 438/527 |
| 5,623,156 A | * | 4/1997 | Watt | 257/355 |
| 6,147,857 A | * | 11/2000 | Worley et al. | 361/301.2 |
| 6,495,442 B1 | * | 12/2002 | Lin et al. | 438/618 |

* cited by examiner

*Primary Examiner*—David Nelms
*Assistant Examiner*—Mai-Huong Tran
(74) *Attorney, Agent, or Firm*—Tung & Associates

(57) ABSTRACT

A multi-level metal interconnect structure and method for forming the same for improving a resistance of CMOS transistors to electrostatic discharge (ESD) transient events is disclosed. A semiconductor device including at least one NMOS transistor electrically connected along at least one circuit pathway to an input/output signal source and a reference voltage potential; and, electrically connecting at least the input/output signal source to the at least one NMOS transistor with a metal interconnect line extended in length by compacting at least a portion of the metal interconnect line length portion into a serpentine shape within a predetermined volume of the semiconductor device.

14 Claims, 3 Drawing Sheets

EXTENDED LENGTH METAL LINE FOR IMPROVED ESD PERFORMANCE

FIELD OF THE INVENTION

This invention generally relates to integrated circuits and more particularly to metal interconnect routing for improving circuit resistance to electrostatic discharge (ESD) events.

BACKGROUND OF THE INVENTION

Integrated circuits (ICs) may be severely damaged by electrostatic discharge (ESD) events. There are generally three sources of electrostatic discharge. One source is from an electrostatically charged human body, referred to as a human body model (HBM). Generally, transient currents with several amperes and potentials of 4 to 5 kV are created during the discharge, and in many cases can surpass the maximum current that a device can carry without producing damage to an IC device. Another source of ESD events is from metallic objects, often referred to as machine model (MM) events, where the potentials created during the transient are several hundred Volts, for example from about 200 to about 400 Volts. A third source is the discharge of the IC itself, which discharges to ground by current flowing out of the IC to ground, also referred to as the charged device model (CDM).

As IC devices decrease in size, the push for smaller dimension devices including metal interconnect lines has been the trend to achieve a higher device density. In addition, insulating dielectric layers have become thinner, leading to higher electrical field strengths for a given applied voltage. Both of these factors have the disadvantage of making an IC semiconductor device more susceptible to damage from ESD events.

Several approaches have been proposed to protect integrated circuits from ESD events. More common approaches include voltage clamping devices and bipolar transistors associated with an NMOS transistor, also referred to as a silicon controlled rectifier (SOR). The drain of the NMOS transistor is connected to an input/output signal source, for example a bonding pad, and the source of the NMOS transistor diffusion region is connected to ground. The SCR acts to trigger voltage clamping circuitry and discharges ESD voltages to ground after being triggered through the NMOS transistor. However, if the ESD voltage introduced into the circuit is above a certain potential, current passing through the gate oxide of the NMOS transistor or other portions of the integrated circuit can be damaged, including gate oxide dielectric breakdown, thereby obviating the protective ESD circuitry. The NMOS transistor resistance to dielectric breakdown may be adjusted to a certain degree by varying the dopant properties of the diffusion regions as well as the widths of the source and drain regions of the transistor. However, when bipolar NMOS transistors are operating under what is referred to as snapback conditions, the generation of current by the ESD transient voltage may cause circuitry failure, including gate oxide dielectric breakdown, where generated currents exceeding a critical value cause self-heating or runaway heating.

In particular, one problem with ESD protection circuits of the prior art, is that the current capacity limits are generally reached at unacceptably low transient voltages, especially in the MM ECD model, where transient voltages are on the order of 200 Volts to about 400 Volts. While ESD protection circuits including SCR circuits have been modified to increase a current carrying capacity, the metal routing of the circuit, including for example, input/output bonding pad to ground, contributes to constraints on current carrying limits by presenting an increased resistance to ground together with debiasing effects, where the potential over the metal routing pathway varies and produces areas of high potential, also referred to as "hot spots".

There is therefore a need in the ESD circuit protection art to increase current carrying capacities of metal interconnect routing to improve the performance of ESD protection circuits thereby reducing gate breakdown events and improving the ESD circuit protection performance.

It is therefore an object of the invention to provide an apparatus and method for increasing current carrying capacities of metal interconnect routing to improve the performance of ESD protection circuits thereby reducing gate breakdown events and improving the ESD circuit protection performance while overcoming other shortcomings and limitations of the prior art.

SUMMARY OF THE INVENTION

To achieve the foregoing and other objects, and in accordance with the purposes of the present invention as embodied and broadly described herein, the present invention provides a multi-level metal interconnect line structure and a method for forming the same for improving a resistance of CMOS transistors to electrostatic discharge (ESD) transient events.

In a first embodiment, the method includes providing a semiconductor device including at least one NMOS transistor electrically connected along at least one circuit pathway to an input/output signal source and a reference voltage potential; and, electrically connecting at least the input/output signal source to the at least one NMOS transistor with a metal interconnect line extended in length by compacting at least a portion of the metal interconnect line length portion into a serpentine shape within a predetermined volume of the semiconductor device.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In a first embodiment of the invention a metal line, preferably copper is formed to extend through a thickness portion of a multiple level semiconductor device circuit electrically connecting a substrate including NMOS transistors and an input/output signal source, for example a bonding pad at an uppermost level of the multiple layer device.

The metal line is preferably formed in a compacted serpentine shape in any one metallization level to increase the total length of the metal line connecting the bonding pad and the CMOS transistor structure.

Figure 1:
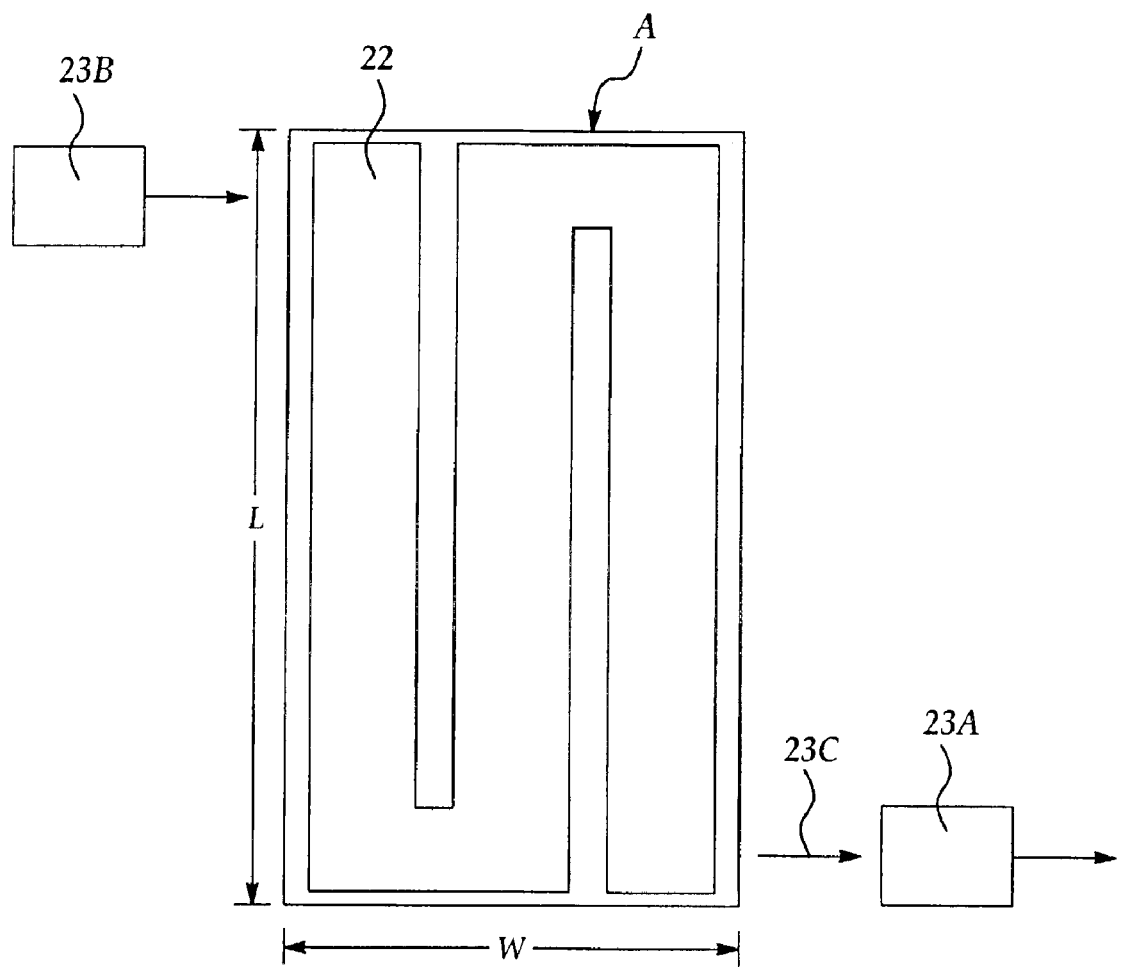
FIGS. 1 is a top planar view of a portion of an extended metal interconnect line according to an embodiment of the invention.

In an exemplary embodiment referring to FIG. 1, is shown a top planar view of a portion of an exemplary metallization layer, for example a third metallization level (layer) showing a compacted serpentine structure of a portion of the metal interconnect line 22 making up the metallization routing configuration according to an embodiment of the invention. The metal interconnect line is compacted into a serpentine structure to increase the length of the metal interconnect line within a predefined volume of the device and to minimize metal routing space taken up by the lengthened metal interconnect line. For example the predetermined volume is positioned underneath and in electrical contact with one or more bonding pads and in electrical interconnection with CMOS transistors, for example one or more NMOS transistors forming circuitry within the device. For example, the metal interconnect line 22, preferably copper due to its low resistivity, is shown formed in a compacted serpentine structure where the metal interconnect line 22 is compacted into a predefined rectangular area A having a width W and a length L. I/O pad 23A and Voltage Pad 23B are shown schematically electrically connected e.g., arrow 23C, to the metal interconnect line 22. Preferably the length L of the metal line within the rectangular area is from about 300 microns to about 2500 microns, more preferably from about 1000 microns to about 2000 microns. The metal line 22 preferably has a width of about 3 to about 8 microns, more preferably about 5 microns. For example, in one embodiment, the length L of the rectangular area is about 700 microns and the width W is 350 microns. Preferably an aspect ratio of length L to width W is from about 1.5:1 to about 2.5:1 to maximize metal interconnect line length and minimize area or volume used in the device. The metal interconnect line is preferably formed by a multi-layer copper damascene process formed in parallel with the formation of other metal interconnect structures in the multiple metallization layers, for example a multiple level semiconductor device having from about 3 to about 8 metallization layers.

For example the serpentine shape of metal interconnect line 22 is formed, for example by plurality of spaced apart parallel metal interconnect lines formed within the predetermined rectangular area A that alternately physically connect at the length ends of the plurality of metal lines to provide an electrically and physically continuous metal interconnect line. Preferably, the metal interconnect line 22 is extended in a thickness direction in each metallization layer by forming a subsequent overlying portion of the metal interconnect line 22 in an overlying metallization layer in the same layout as in an underlying metallization layer and formed in physically continuous contact with the underlying layer portion to provide a physically continuous metal line within the predetermined area extending in a thickness direction to form a predetermined volume of the device. In another embodiment, one or more metallization layers electrically interconnect physically discontinuous portions of the metal interconnect line with an overlying or underlying portion of the metal interconnect line through wide vias preferably having a width about equal to the width of the metal interconnect line.

Figure 2A:
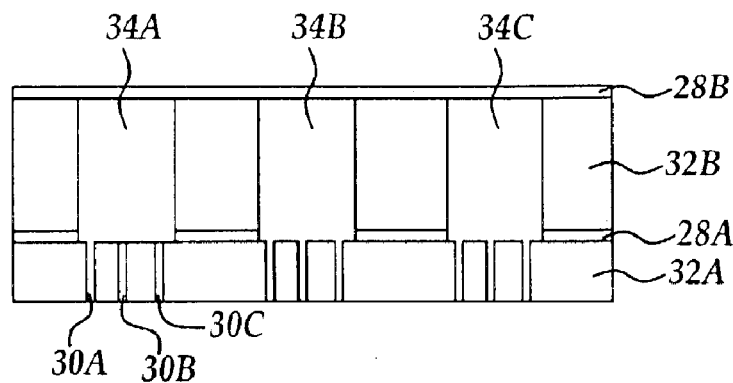
FIGS. 2A through 2C are cross sectional side views of portion of an extended metal interconnect line at stages in manufacture according to embodiments of the invention.

Referring to FIG. 2A, is shown an exemplary cross sectional portion of the serpentine shaped metal interconnect line showing the second and third metallization layers in a device where the first layer of the multiple layer serpentine shaped metal interconnect line structure begins in the third metallization layer. For example, portions of the metal interconnect line 34A, 34B, and 34C appear as separate portions in cross section of the continuous serpentine shaped metal interconnect line 22 shown in FIG. 1. Formed in underlying dielectric layer 32A (e.g., second metallization layer) are vias, e.g., 30A, 30B, and 30C, for example previously formed by a damascene or metal line etching process and formed of tungsten, aluminum or copper. The vias e.g., 30A, 30B, and 30C, make electrical interconnect contact with a semiconductor substrate (not shown) including CMOS transistor devices, for example source, drain, and gate regions of NMOS transistors connected to ground, preferably being part of input or output buffer circuitry, ESD protection circuitry, or core circuitry.

In forming the metal interconnect line, preferably by a damascene process, a continuous trench line opening for forming the continuous metal line, shown as portions e.g., 34A, 34B, and 34C in cross section, is first formed in dielectric layer 32B by a conventional photolithographic and patterning process followed by a reactive ion etch (RIE) process. Next, a barrier layer (not shown), for example a refractory metal and/or nitrides thereof such as tantalum and titanium, is deposited to line the trench line opening. Although other metals may be used such as aluminum/copper alloys, copper is preferred due its low resistivity and ease of forming damascene structures, preferably by an electro-chemical deposition (ECD) process preceded by deposition of a copper seed layer to line the trench opening.

Following ECD of the copper layer, a copper CMP process is used to planarize the metallization layer to include removing at least a portion of the barrier layer overlying the trench level. Following the copper CMP process, a protective layer 28B, including materials selected from the group consisting of silicon nitride, silicon oxynitricie, and silicon carbide, is formed over the trench line level. The same process may be used to form a protective layer, e.g., 28A over dielectric layer 32A following the via formation process. It will be appreciated that the formation of the metal line portions e.g., 34A, 34B, and 34C may be formed as part of a damascene or dual damascene process in parallel with the formation of other metal interconnect line structures such as vias and/or dual darnascene structures elsewhere in the device. In addition, the formation of the metal interconnect line may extend through a thickness of more than one dielectric layer including intervening etch stop layers. Preferably, the thickness of the metal line portions e.g., 34A, 34B, and 34C are formed in each metallization layer to a thickness of about 1 micron but may be formed to lesser of greater thicknesses, for example up to about 5 microns, depending on the dielectric layer thickness and process requirements for forming other metal interconnect lines structures in parallel.

Figure 2B:
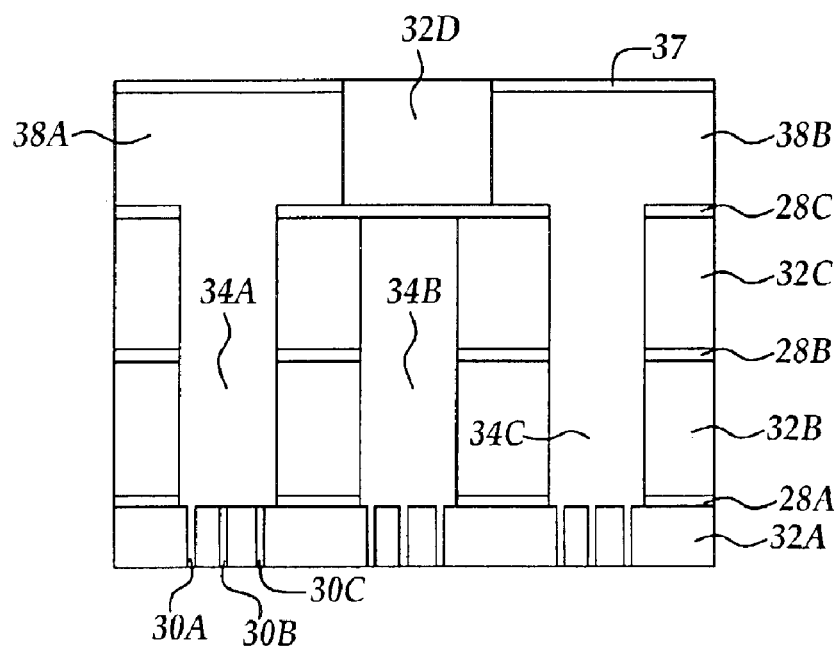

Referring to FIG. 2B, is shown a subsequent metallization layer, for example a fourth metallization layer, with the metal interconnect line portions e.g., 34A, 34B, and 34C, extended from the third metallization layer upward into a fourth metallization layer, e.g., dielectric layer 32C. Preferably, the metal interconnect line is physically continuous including portions e.g., 34A, 34B, and 34C, extending from a lower third metallization layer to an upper most metallization layer. For example, the total number of metallization layers in the device may be about eight, where the metal interconnect line formed according to preferred embodiments, extends physically continuously from the third metallization layer to the uppermost metallization layer where electrical contact with at least one bonding pad is made. For example, the metal interconnect line including portions e.g., 34A, 34B, and 34C, may extend up to an upper most metallization layer with at least a portion of the metal line e.g., 34A and 34C, positioned and in electrical contact underneath at least one respective bonding pad e.g., 38A and 38B, formed in dielectric insulating layer e.g., 32D metallization layer). The bonding pads e.g., 38A and 38B may be formed by a similar copper damascene process as the metal interconnect line, including protective layer 28C, or may be an aluminum:copper alloy formed by a PVD method. The bonding pads may optionally include the formation of a bonding layer over the copper bonding pads, for example a nickel alloy layer 37.

Figure 2C:
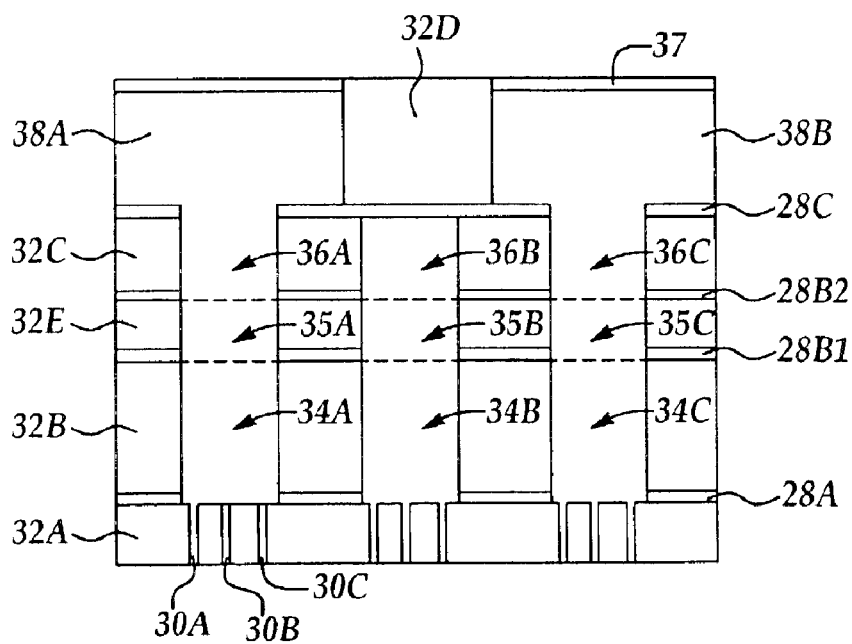

Referring to FIG. 2C, in another embodiment, the metal interconnect line formed according to preferred embodiments, extends through at least one metallization layer, where wide vias, e.g., 35A, 35B, and 35C, preferably about the same width as the metal interconnect line, e.g., portions 34A, 34B, and 34C, may be used to electrically connect portions of the metal interconnect line in an underlying metallization layer e.g., 32B with an overlying metallization layer e.g., 32C through an intervening insulating dielectric layer e.g., 32E. The continuous metal interconnect linen e.g., portions 36A, 36B, and 36C continue in the substantially the same shape and layout as the underlying continuous metal interconnect line e.g., portions 34A, 34B, and 34C. For example, preferably there is not more than one successive intervening insulating dielectric layer e.g., 32E separating the continuity of the metal interconnect line between metallization layers. Where such an intervening insulating dielectric layer is necessary, a plurality of wide vias, about the same width as the metal interconnect line are provided, through the intervening insulating dielectric layer e.g., 32E such that the metal interconnect line is physically discontinuous through the intervening insulating dielectric layer, but is electrically continuous, without significantly increasing a resistance of the metal interconnect line. The metal interconnect lines are connected by a plurality of wide vias e.g., 35A, 35B, and 35C where the metal line interconnect is formed in substantially the same layout above and below the intervening insulating dielectric layer e.g., 32E.

Figure 3:
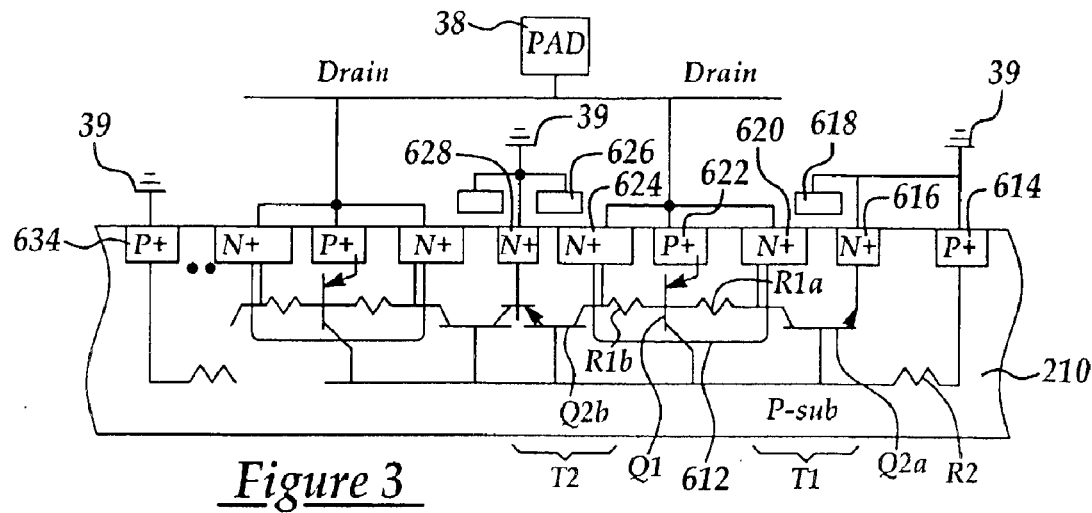
FIG. 3 is an exemplary schematic cross sectional diagram of a portion of an ESD voltage clamping means according to an embodiment of the present invention.

Referring to FIG. 3 is shown a partial cross sectional view of an exemplary ESD protection circuit voltage clamping means, for example a low-trigger embedded SCR for on chip ESD protection. U.S. Pat. No. 6,492,208B1 is hereby incorporated by reference. The SCR protection circuitry is for a 5 volt I/O device. The embedded SCR protection device for an output and input pad of an n-channel transistor circuit comprises a semiconductor wafer (not shown) with a p-substrate 210. Implanted in p-substrate 210 are a first n+ and a second n+ diffusion 616 and 628, respectively, which are the source of a first and a second n-channel transistor T1 and T2. The first transistor T1 further comprises n+ drain 620 and polysilicon gate 618. The second transistor T2 further comprises n+ drain 624 and polysilicon gate 626. Gate 618 and source 616 are connected by conductive means, for example including the extended metal interconnect line according to preferred embodiments, to reference voltage potential (e.g., ground potential) 39. Gate 626 and source 628 are similarly connected to reference voltage potential 39. Between drains 620 and 624 is implanted a first p+ diffusion 622. Drains 620 and 624 and p+ diffusion 622 are all connected by conductive means, for example including the metal interconnect line according to preferred embodiments, to chip pad 38. An n-well 612 is implanted in p-substrate 21, n-well 612 extending from halfway under n+ drain 620 to halfway under n+ drain 624. The above structure creates a parasitic silicon controlled rectifier S1, which includes three parasitic bipolar transistors: pnp transistor Q1, its emitter, base, and collector formed by first p+ diffusion 622, n-well 612, and p-substrate 21, respectively; npn transistor Q2a, its emitter, base, and collector formed by source 616, p-substrate 21, and drain 620, respectively; npn transistor Q2b, its emitter, base, and collector formed by source 628, p-substrate 21, and drain 624, respectively. Resistors R1a and R1b from the base of transistor Q1 to drains 620 and 624, respectively, represent the parasitic resistance of n-well 612. Resistor R2 from p+ diffusion 614 to the base of transistor Q2a represents the parasitic resistance of p-substrate 21. The above structure further comprises a second p+ diffusion 614 embedded at one perimeter of the above structure and a third p+ diffusion 634 embedded at the other perimeter of the above structure. Both second and third p+ diffusions are connected to reference voltage potential 39 through conductive means, for example including the metal interconnect line according to preferred embodiments. Because the SCR is embedded, the SCR trigger voltage is equal to or less than 2 volt and protects the transistor circuit from electrostatic discharge, particularly in 0.15 micron (1 micron=10.sup.−6 meter) 5 volt technology.

Figure 4:
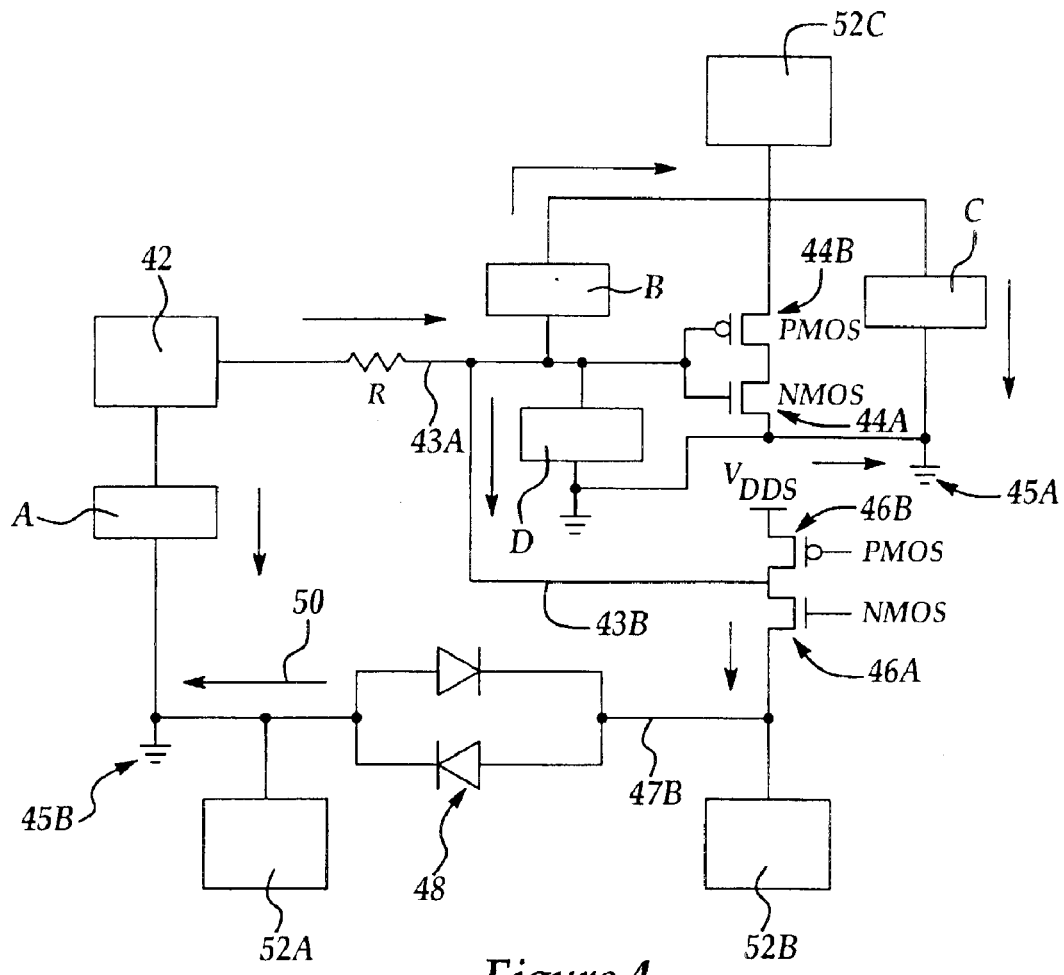
FIG. 4 is a circuit diagram including metal interconnects and ESD protection circuitry according to embodiments of the present invention.

Referring to FIG. 4 is shown an exemplary semiconductor device schematic circuit diagram including ESD protection circuitry. Shown is an input output pad 42 connected through a resistance R by metal drain line circuit pathway 43A, preferably including the metal interconnect line according to preferred embodiments, to input buffer e.g., NMOS transistor 44A and PMOS transistor 44B. NMOS transistor 44A is connected to reference voltage potential e.g. reference ground potential 45A. Also shown is output buffer e.g., NMOS transistor 46A and PMOS transistor 46B connected to input/output pad 42 thorough metal drain line circuit pathway 43B and 43A, preferably including the metal interconnect line according to preferred embodiments. Output buffer NMOS transistor 46A is connected to reference voltage potential e.g., 45B by circuit pathway 47B through ESD protection circuitry 48, for example diode protection circuitry. Current flow is shown in one embodiment according to directional arrows, e.g., 50. Voltage clamping means e.g., A, B, C, D, for example the SCR protection circuitry shown in FIG. 4, are provided for clamping transient voltages such as ESD transients prior to passing the transient current to ground. Voltage pads, for example VSS 52A, VSSS 52B, and VDDS 52C are shown which may also be optionally connected to circuit pathways including the metal interconnect line according to preferred embodiments passing to reference voltage potential, for example Voltage pad 52B and Voltage pad 52A. Preferably, according to an embodiment of the present invention all or a portion of the circuit pathways passing from the input/output pad through NMOS transistors to reference voltage potential e.g., 45A, 45B include the metal interconnect line according to preferred embodiments. Optionally, other circuit pathways connect to reference voltage potential passing through voltage clamping means e.g., A, B, C, D at least partially include the metal interconnect line according to preferred embodiments.

It has been found according to preferred embodiments of the present invention, that the metal interconnect line advantageously acts to decrease an overall circuitry resistance and equalize potentials within the device circuitry. As a result, the performance of ESD protection circuitry is enhanced, especially in the voltage range for the MM ESD model, where it has been found in an exemplary implementation, that peak currents of up to about 2.6 Amperes and at voltages of up to 350 Volts, can be sustained during ESD transient events without damage to the circuitry including NMOS transistors and associated gate oxides.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A multi-level metal interconnect structure for an NMOS transistor containing integrated circuit comprising:
   at least one NMOS transistor disposed along at least one circuit pathway in a multi-level semiconductor device between reference voltage potential and at least one bonding pad comprising one of an input/output signal source and a voltage source; and,
   at least one metal interconnect line forming at least a portion of the at least one circuit pathway, the at least one metal interconnect line extended in length along at least a portion of the circuit pathway by forming a compacted serpentine shaped pathway within a predetermined volume of the semiconductor device, the predetermined volume extending through a plurality of metallization levels.

2. The multi-level metal interconnect structure of claim 1, wherein the at least one metal interconnect line extends electrically continuously from about a third metallization layer to electrically interconnect with the at least one bonding pad disposed in an uppermost level of a multi-level semiconductor device.

3. The multi-level metal interconnect structure of claim 1, wherein the at least one metal interconnect line is about the same width in each metallization layer.

4. The multi-level metal interconnect structure of claim 1, wherein the compacted serpentine shaped pathway comprises a plurality of substantially parallel metal interconnect lines within a metallization layer connected at alternating ends of the plurality of metal lines to form a continuous metal interconnect line.

5. The multi-level metal interconnect structure of claim 1, wherein the predetermined volume comprises a planar area perpendicular to a metallization layer thickness from about 30000 square microns to about 200000 square microns.

6. The multi-level metal interconnect structure of claim 1, wherein the at least one metal interconnect line length within each metallization layer is from about 500 microns to about 2500 microns.

7. The multi-level metal interconnect structure of claim 1, wherein the width of the at least one metal interconnect line is from about 3 to about 8 microns.

8. The multi-level metal interconnect structure of claim 1, wherein at least a portion of the at least one metal interconnect line is disposed in electrical contact underlying the at least one bonding pad.

9. The multi-level metal interconnect structure of claim 1, wherein the at least one metal interconnect line comprises a copper damascene structure in each metallization layer.

10. The multi-level metal interconnect structure of claim 1, wherein ESD protection circuitry comprising the at least one NMOS transistor is provided between the at least one bonding pad and reference voltage potential.

11. The multi-level metal interconnect structure of claim 1, wherein the metal interconnect line is provided along at least a portion of the circuit pathway between the at least one NMOS transistor and reference voltage potential.

12. The multi-level metal interconnect structure of claim 1, wherein the ESD protection circuit comprises an SCR protection circuit.

13. The multi-level metal interconnect structure of claim 1, wherein at least one Voltage clamping means is provided between an input/output signal source and ground potential.

14. The multi-level metal interconnect structure of claim 1, wherein the at least one NMOS transistor comprises one of an input and an output buffer.

* * * * *